(12) United States Patent
Kim et al.

(10) Patent No.: US 9,570,191 B2
(45) Date of Patent: Feb. 14, 2017

(54) CONTROLLING SWAP RATE BASED ON THE REMAINING LIFE OF A MEMORY

(71) Applicant: Samsung Electronics Co., Ltd., Gyeonggi-do (KR)

(72) Inventors: Jong-Tae Kim, Gyeonggi-do (KR); Sun-Ae Seo, Gyeonggi-do (KR); Dong-Jun Shin, Gyeonggi-do (KR); Hee-Sub Shin, Gyeonggi-do (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 166 days.

(21) Appl. No.: 14/257,230

(22) Filed: Apr. 21, 2014

(65) Prior Publication Data

US 2014/0317373 A1 Oct. 23, 2014

(30) Foreign Application Priority Data

Apr. 19, 2013 (KR) .......................... 10-2013-0043498

(51) Int. Cl.
*G11C 16/34* (2006.01)
*G06F 11/00* (2006.01)
*G06F 12/02* (2006.01)
*G06F 12/08* (2016.01)

(52) U.S. Cl.
CPC .......... *G11C 16/349* (2013.01); *G06F 11/004* (2013.01); *G06F 11/008* (2013.01); *G06F 12/0246* (2013.01); *G06F 12/08* (2013.01); *G06F 2201/81* (2013.01); *G06F 2212/1036* (2013.01); *G06F 2212/7204* (2013.01)

(58) Field of Classification Search
CPC ............ G06F 3/0616; G06F 2212/1036; G06F 2212/7204; G06F 2212/7211; G11C 13/0035; G11C 16/349–16/3495
See application file for complete search history.

(56) References Cited

U.S. PATENT DOCUMENTS

| 2005/0060618 A1* | 3/2005 | Guha ................... G06F 11/008 714/54 |
| 2010/0185809 A1* | 7/2010 | Chan ...................... G06F 12/08 711/104 |
| 2011/0197034 A1 | 8/2011 | Nakanishi et al. |

(Continued)

FOREIGN PATENT DOCUMENTS

WO WO 2009118527 A1 * 10/2009 ......... G11B 20/1883

OTHER PUBLICATIONS

Racherla et al. IBM Midrange System Storage Hardware Guide. Mar. 2010. IBM. pp. 231-233, 247-248, 429-435, 483-485.*

(Continued)

*Primary Examiner* — Nathan Sadler
(74) *Attorney, Agent, or Firm* — Cha & Reiter, LLC (57) ABSTRACT

A method of managing a memory in an electronic device is provided that includes calculating an indication of remaining life of a memory component that is used as a swap space by the electronic device; and adjusting the use of the memory component as a swap space based on the indication of remaining life, wherein the adjusting includes one of: (i) reducing a rate at which data is swapped in and out of the memory component, and (ii) discontinuing the use of the memory component as a swap space.

20 Claims, 7 Drawing Sheets

(56) References Cited

U.S. PATENT DOCUMENTS

2015/0227454 A1* 8/2015 Lee ...................... G06F 12/023
　　　　　　　　　　　　　　　　　　　　　711/105

OTHER PUBLICATIONS

Balakrishnan et al. "Differential RAID: Rethinking RAID for SSD Reliability." Jul. 2010. ACM. ACM Transactions on Storage. vol. 6. No. 2. Art. 4.*
Ju-Young Jung and Sangyeun Cho. "Memorage: Emerging Persistent RAM based Malleable Main Memory and Storage Architecture." Jun. 2013. ACM. ICS'13. pp. 115-126.*
Saxena et al. "FlashVM: Virtual Memory Management on Flash." Jun. 2010. USENIX. ATC '10.*
Lee et al. "Lifetime Management of Flash-Based SSDs Using Recovery-Aware Dynamic Throttling." Feb. 2012. USENIX. FAST '12.*

* cited by examiner

FIG.2B (REPLACEMENT SHEET)

CONTROLLING SWAP RATE BASED ON THE REMAINING LIFE OF A MEMORY

CLAIM OF PRIORITY

This application claims the benefit under 35 U.S.C. §119 (a) of a Korean patent application filed in the Korean Intellectual Property Office on Apr. 19, 2013 and assigned Serial No. 10-2013-0043498, the entire disclosure of which is hereby incorporated by reference.

BACKGROUND

1. Field

The present disclosure relates to an electronic device, and more particularly to a method for managing a memory of the electronic device.

2. Description of the Related Art

As electronic devices such as smart phones and tablet Personal Computers (PCs) have become faster and more sophisticated, users have begun using these devices to perform advanced functions, such as multimedia playback, calendar management, gaming, entertainment system remote control, and photography. With the increase in the number of functions performed by electronic devices, the amount of system memory required by the electronic devices to perform these functions has also increased. When the amount of memory required is not available, the operation of the electronic devices may suffer.

To prevent the operation of electronic devices from suffering, techniques for securing additional memory space are often utilized. For example, when the main memory of an electronic device is full, some of the data stored in the main memory may be moved to a swap space provided by a sub-memory. When corresponding data are requested, the main processor of the electronic device may transfer the corresponding data from the sub-memory to the main memory and then serve the request from the main memory. The function of transferring data between the system memory and the sub-memory can be referred to as a swap function.

However, there is at least one disadvantage associated with the use of swap functions. Due to limitations in the technology used to implement sub-memory modules, the number of times data can be read or written to a sub-memory module may be limited. Accordingly, when an electronic device uses a swap function frequently, the electronic device may prematurely exhaust the life of its sub-memory and cause it to malfunction. Such malfunction of the sub-memory may in turn cause the electronic device to stop operating correctly.

Therefore, the need exits for swapping techniques that efficiently utilize sub-memory modules of electronic devices, so as to prolong the life of the sub-memory modules and/or their respective electronic devices.

SUMMARY

An aspect of the present invention is to solve at least the above-mentioned problems and/or disadvantages and to provide at least the advantages described below. Another aspect of the present invention is to a method and apparatus for managing a memory in an electronic device.

Another aspect of the present invention is to provide a method and apparatus for adjusting a use rate of a sub-memory according to a remaining lifetime of the sub-memory in an electronic device.

Another aspect of the present invention is to provide a method and apparatus for calculating a remaining lifetime of a sub-memory based on state information of the sub-memory in an electronic device.

Another aspect of the present invention is to provide a method and apparatus for providing information about a remaining lifetime of a sub-memory to a user in an electronic device.

Another aspect of the present invention is to provide a method and apparatus for adjusting an input and output rate of a swap function when a remaining lifetime of a sub-memory is greater than or equal to a predetermined threshold lifetime in an electronic device.

Another aspect of the present invention is to provide a method and apparatus for ending a swap function when a remaining lifetime of a sub-memory is less than a predetermined threshold lifetime in an electronic device.

The present disclosure addresses this need. According to one aspect of the disclosure, a method is provided comprising: calculating an indication of remaining life of a memory component that is used as a swap space by an electronic device; and adjusting the use of the memory component as a swap space based on the indication of remaining life, wherein the adjusting includes one of: (i) reducing a rate at which data is swapped in and out of the memory component, and (ii) discontinuing the use of the memory component as a swap space.

According to another aspect of the disclosure, an electronic device is provided comprising: a first memory component used as a system memory by the electronic device; a second memory component that is used as a swap space for the first memory component; and a processor configured to: calculate an indication of remaining life of the second memory component; and adjust the use of the second memory component as a swap space based on the indication of remaining life, wherein the adjusting includes one of: (i) reducing a rate at which data is swapped in and out of the second memory component, and (ii) discontinuing the use of the second memory component as a swap space.

BRIEF DESCRIPTION OF THE DRAWINGS

The above and other aspects, features and advantages of the disclosure will be more apparent from the following detailed description taken in conjunction with the accompanying drawings, in which.

DETAILED DESCRIPTION

Aspects of the present disclosure will be described herein below with reference to the accompanying drawings. For the purposes of clarity and simplicity, well-known functions or constructions are not described in detail as they may obscure aspects of the disclosure that are more pertinent.

Figure 1A:
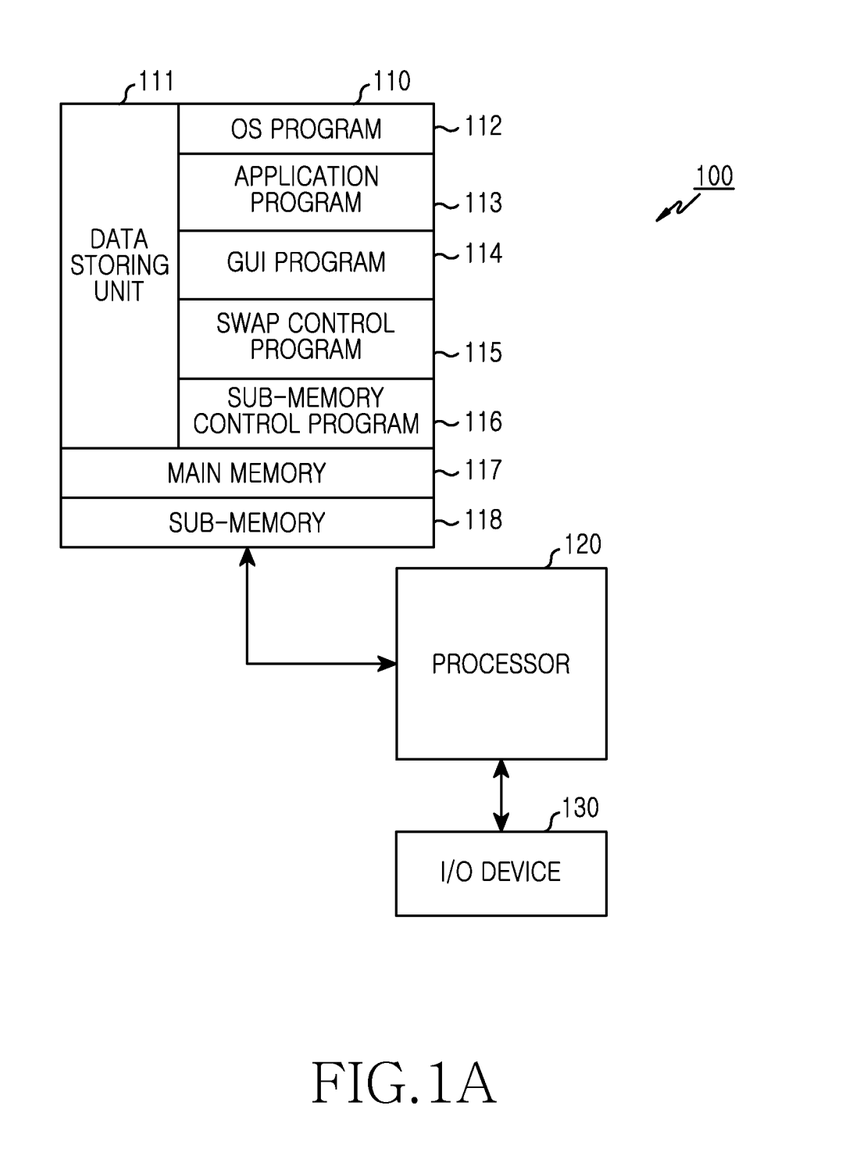
FIG. 1A is a block diagram of an electronic device, according to aspects of the present disclosure.

FIG. 1A is a block diagram of an electronic device 100 according to aspects of the disclosure. The electronic device 100 may be a mobile communication terminal, a smart phone, a tablet PC, a digital camera, a Moving Picture Experts Group (MPEG) layer 3 (MP3) player, a navigation device, a laptop computer, a netbook, a computer, a television, a refrigerator, an air conditioner, and/or any other suitable electronic device having a main memory and a sub-memory.

Referring to FIG. 1A, the electronic device includes a memory 110, a processor 120, and an Input/Output (I/O) device 130. The memory 110 and the processor 120 may be configured as a plurality of memories and a plurality of processors, respectively.

The memory 110 includes a data storing unit 111, an Operating System (OS) program 112, an application program 113, a Graphic User Interface (GUI) program 114, a swap control program 115, a sub-memory control program 116, a main memory 117, and a sub-memory 118, etc. In some implementations, each of the programs may be implemented as a set of processor-executable instructions.

The data storing unit 111 stores data generated as a result of the execution of one or more of the programs stored in the memory 110. The data storing unit 111, according to one aspect of the present disclosure, may store state information about the sub-memory 118. The state information of the sub-memory 118 may include information obtained from a S.M.A.R.T. (Self-Monitoring, Analysis and Reporting Technology) system of the sub-memory 118 and/or any other suitable information.

In some implementations, the data storing unit 111 may store an indication of a remaining life of the sub-memory 118. For example, the data storing unit 111 may store a measure of a remaining lifetime of the sub-memory 118. As another example, the data storing unit 111 may store information indicating the use life of the sub-memory 118 (e.g., information indicating the extent to which the sub-memory 118 has been used so far). The information about the remaining lifetime and use life of the sub-memory 118 may be stored as a percentage value. For example, the data storing unit 111 may store an indication that the remaining lifetime of the sub-memory 118 is equal to 80% of the sub-memory's full life. As another example, the data storing unit 111 may store an indication that the extent to which the sub-memory 118 has been used so far equals to 20% of the total usage the sub-memory 118 is rated for. In some instances, the sub-memory 118 may include a NAND-based flash memory. Additionally or alternatively, in some instances, the sub-memory 118 may be implemented, as a Hard Disk Drive (HDD), an embedded MultiMedia Card (eMMC), or a Solid State Drive (SSD), and or any other suitable memory module.

Additionally or alternatively, the data storing unit 111 may store a threshold on the remaining life of the sub-memory 118. The threshold may be used to control a swap function of the main memory 117 to the sub-memory 118. For example, when the remaining lifetime of the sub-memory 118 is less than or equal to 70%, the data storing unit 111 may store information indicating that a data input and output rate of the swap function is to be lowered. As can be readily appreciated by those skilled in the art, in some implementations, lowering the input and output rate of the swap function may include reducing the frequency at which data is written to or read from the sub-memory 118. As another example, when the remaining lifetime of the sub-memory 118 is less than or equal to 50%, the data storing unit 111 may store information indicating that the swap function should stop being used. In some instances, the data storing unit 111 may determine an input and output rate of the swap function or store information indicating that the swap function is ended according to the remaining lifetime information of the sub-memory 118.

The OS program 112 (e.g., embedded OS such as Windows, Linux, Darwin, RTXC, UNIX, OS X, or VxWorks) includes several software components for controlling a general system operation. For example, control of the general system operation may include memory management and control, storage hardware (device) control and management, power control and management, etc. The OS program 112 may also provide an interface between several hardware components (devices) and software components (programs).

The application program 113 includes applications, such as a browser function application, an email function application, a message function application, a word processing function application, an address book function application, a widget function application, a Digital Right Management (DRM) function application, a voice recognition function application, a voice copy function application, a position determining function application, a location based service function application, a call function application, etc.

The GUI program 114 includes at least one software component for providing a UI using graphics between a user and the electronic device 100. For example, the GUI program 114 may include at least one software component for displaying UI information on the I/O device 130. The GUI program 114 according to one embodiment may be configured to output an indication of the remaining life of the sub-memory 118 to the user. For example, the GUI program 114 may be configured to display a pop-up message indicating the remaining life of the sub-memory 118 is 80%. As another example, the GUI program 114 may be configured to display an icon indicating that the remaining life of the sub-memory 118 is 70%.

Additionally or alternatively, the GUI program 114 may be configured to display an indication that the use of the swap function has been discontinued based on the remaining lifetime of the sub-memory 118. More particularly, in one example, the GUI program 114 may be configured to display a pop-up message indicating that the use of the swap function has been discontinued.

The swap control program 115 may perform the swap function based on an indication of remaining life of the sub-memory 118. As noted above, the indication of remaining life of the sub-memory 118 may include at least one of: a measure of remaining lifetime of the sub-memory, an indication of the extent to which the sub-memory 118 has been used so far, and/or any other suitable information that is indicative of how long the sub-memory 118 has before failing.

In one example, the swap control program 115 may compare the indication of remaining life of the sub-memory 118, to a first threshold. If the indication of remaining life of the sub-memory 118 is greater than the first threshold, the swap control program 115 may perform the swap function at a predetermined input and output rate supported in the corresponding electronic device 100. For example, when the indication of remaining life of the sub-memory 118 is greater than the predetermined first threshold, the swap control program 115 may perform the swap function 60%. In some instances, the above tasks may be performed periodically in order to be able to detect when the remaining life of the sub-memory 118 falls below (or becomes equal to) the first threshold.

When the indication of remaining life of the sub-memory 118 is less than or equal to the first threshold, the swap control program 115 may compare the indication of remaining life of the sub-memory 118 to a second threshold. When the indication of remaining life of the sub-memory 118 is greater than the second threshold, the swap control program 115 may adjust a swap input and output rate according to the indication of remaining life of the sub-memory 118. In particular, when the indication of remaining life of the sub-memory 118 is greater than the second threshold, the swap control program 115 may perform the swap function at an input and output rate that is determined dynamically based on the indication of remaining life. Herein, the less the remaining lifetime of the sub-memory 118, the greater the reduction of the input and output rate of the swap function. In some instances, the above tasks may also be performed periodically in order to determine when remaining life of the sub-memory 118 falls below (or becomes equal to) the second threshold.

When the remaining lifetime information of the sub-memory 118 is less than or equal to the second threshold, the swap control program 115 may stop performing the swap function, thereby discontinuing the use of the sub-memory 118 as a swap space for the electronic device 100.

The sub-memory control program 116 may request the sub-memory 118 to transmit state information of the sub-memory 118 and receive the state information of the sub-memory 118 from the sub-memory 118. Herein, the state information of the sub-memory 118 may include any information about the sub-memory 118. In addition, the state information of the sub-memory 118 may include information that is collected by a S.M.A.R.T. monitoring system of the sub-memory 118.

The main memory 117 may exchange data with the processor 120 directly and provide storage for various programs that are executed by the processor 120. The main memory 117 may output data to the sub-memory 118 by control of the sub-memory control program 116 executed by the processor 120 and adjust a rate reading data from the sub-memory 118. The main memory 117 may be larger than the sub-memory 118.

The sub-memory 118, as discussed above, is a memory used to subserve limited capacity of the main memory 117, and may receive and record data from the main memory 117 and output the recorded data to the main memory 117

The processor 120 may include an ARM-based processor, an x86 processor, and/or any other suitable type of electronic circuitry that is configured to perform at least some of the functions and operations described in the specification. Although it is not shown in FIG. 1A, the processor 120 may include at least one processor and a peripheral interface. Also, the processor 120 executes a specific program (instruction set) stored in the memory 110 and performs a plurality of specific functions corresponding to the program.

The I/O device 130 includes an input device for receiving data and an output device for outputting data. For example, the I/O device 130 may be a touch screen which simultaneously performs data input and output. The I/O device 130 according to one aspect of the disclosure may display the indication of the remaining life of the sub-memory 118. In addition, when an input and output rate of the swap function is changed, the I/O device 130 may display an indication that an input and output rate of the swap function is changed.

Herein, the data storing unit 111, the various programs 112 to 115, the main memory 117, and/or the sub-memory 118 of the memory 110 are separately shown for convenience of description. However, in some implementations, the data storing unit 111 and the various programs 112 to 115 of the memory 110 may be included in the main memory 117 and/or the sub-memory 118.

Figure 1B:
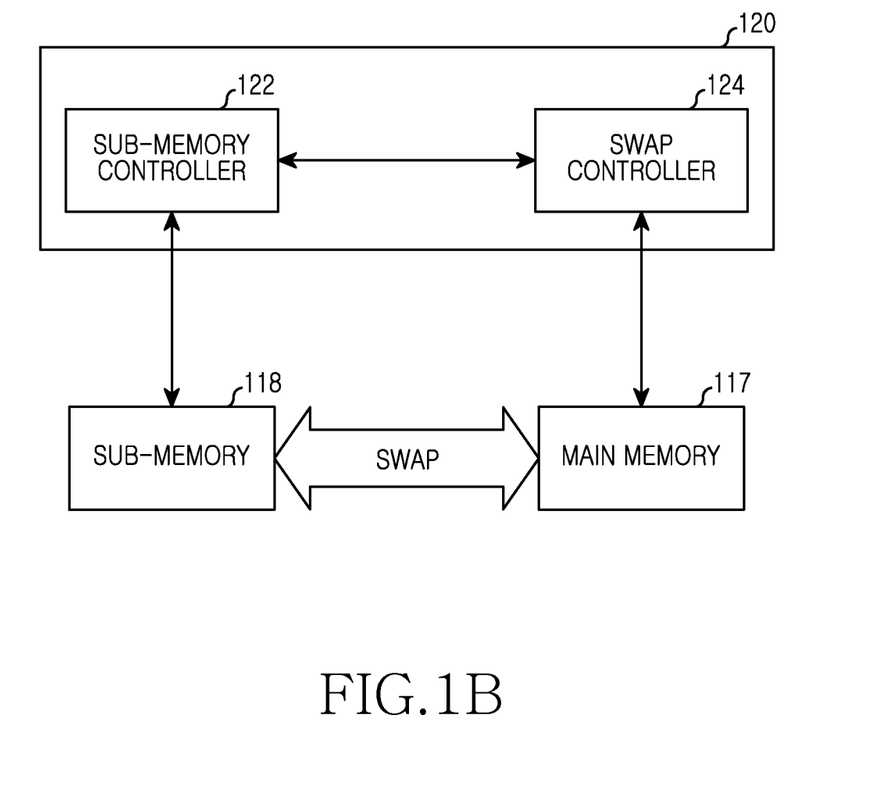
FIG. 1B is a block diagram of a processor that is part of the electronic device, according to aspects of the present disclosure.

FIG. 1B is a block diagram of the processor 120 in accordance with aspects of the disclosure. As illustrated, the processor 120 includes a sub-memory controller 122 and a swap controller 124.

When a request to transmit state information of the sub-memory 118 is received from the swap controller 124, the sub-memory controller 122 may read the state information of the sub-memory 118 from the sub-memory 118 and transmit the corresponding state information to the swap controller 124. In some implementations, the swap controller 124 may request the sub-memory controller 122 to transmit the state information of the sub-memory 118 when the electronic device 100 boots up. Additionally or alternatively, in some implementations, the swap controller 124 may request the sub-memory controller 120 to transmit the state information periodically. Additionally or alternatively, in some implementations, the swap controller 124 may request the sub-memory controller 120 to transmit the state in response to the device 100 receiving user input (i.e., in response to a user input reception event).

In some implementations, the swap controller 124 may determine an indication of remaining life of the sub-memory 118 by using the state information received from the sub-memory controller 122. For example, the swap controller 124 may determine the indication of remaining life of the sub-memory 118 based on a S.M.A.R.T attribute value, such as a reallocated sectors count value, a seek error rate value, a spin retry count value, a reallocation event count value, and/or a current pending sectors count value. In some instances, any S.M.A.R.T. attribute value that is obtained may be weighted in accordance with a predetermined weight.

As another example, in instances where the sub-memory 118 is implemented by using a flash memory card, such as a flash memory card that is compliant with the eMMC 5.0 standard of the Joint Electron Device Engineering Council (JEDEC), the swap controller 124 may determine the indication of remaining life of the sub-memory 118 based on a state information value of a register of the eMMC. As another example, the swap controller 124 may determine lifetime of the sub-memory 118 based on the number of times that data input and output is currently performed and the number of times that data input and output for the sub-memory 118 is guaranteed.

Additionally or alternatively, in some implementations, when the indication of remaining life of the sub-memory 118 is less than a predetermined threshold lifetime, the swap controller 122 may display a warning message indicating that the remaining life of the sub-memory 118 is less than the threshold lifetime.

Additionally or alternatively, in some implementations, the swap controller 124 may control the transfer of data between the main memory 117 and the sub-memory 118 in accordance with the indication of remaining life of the sub-memory 118. For example, when the indication of remaining life of the sub-memory 118 is greater than a first threshold, the swap controller 124 may perform data input and output of the main memory 117 to the sub-memory 118 at a predetermined rate. When the indication of remaining life of the sub-memory 118 becomes less than or equal to the first threshold while being greater than a second threshold, the swap controller 124 may perform data input and output of the main memory 117 to the sub-memory 118 at a variable rate that depends on the indication of remaining life of the sub-memory 118. When the remaining life of the sub-memory 118 is less than or equal to the second threshold, the swap controller 124 may stop the transfer of data between the main memory 117 and the sub-memory 118, effectively stopping the use of the sub-memory 118 as a swap space for the main memory 117.

Figure 2A:
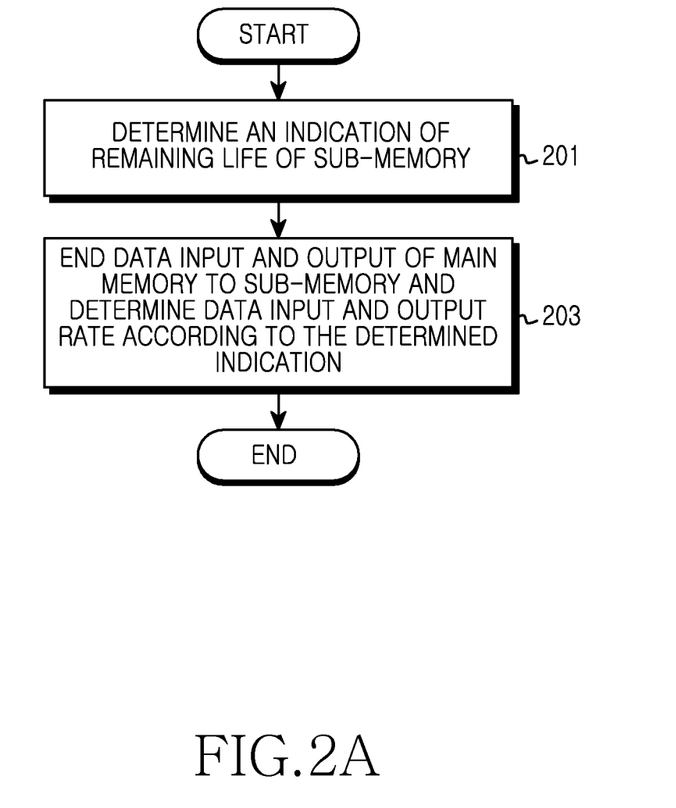
FIG. 2A is a flowchart illustrating a process of controlling data input and output of a main memory to a sub-memory, according to lifetime information of the sub-memory in an electronic device according to aspects of the present disclosure.

FIG. 2A is a flowchart illustrating a process of controlling data input and output of a main memory to a sub-memory according to indication of remaining life of the sub-memory in an electronic device according to one embodiment of the present invention.

Referring to FIGS. 1A and 2A, in step 201, the electronic device 100 determines an indication of remaining life of the sub-memory 118. That is, when an event for determining the remaining life of the sub-memory 118 is generated, the electronic device 100 may determine the remaining life of the sub-memory 118. For example, when the electronic device 100 is booted, it may determine the remaining life of the sub-memory 118. As another example, when a threshold time elapses, the electronic device 100 may determine the remaining life of the sub-memory 118. As yet another example, when the input of a user is received, the electronic device 100 may determine the remaining life of the sub-memory 118. In some implementations, the indication of remaining life of the sub-memory 118 may be determined and stored in the sub-memory itself. Or the indication of remaining life of the sub-memory 118 may be determined and stored in an OS or a separate device according to a design type and a kind of the electronic device 100.

Thereafter, the electronic device 100 may proceed to step 203, and ends the data input and output of the main memory 117 to the sub-memory 118 or determine a data input and output rate according to the verified indication of remaining life of the sub-memory 118. That is, the electronic device 100 may extend a life of the sub-memory 118 and its life by determining the remaining life of the sub-memory 118 and adjusting the data input and output rate of the main memory 117 to the sub-memory 118 to be lowered or ending the data input and output of the main memory 117 to the sub-memory 118 according to the remaining life of the sub-memory 118. Herein, the data input and output of the main memory 117 to the sub-memory 118 means data input and output of a swap function generated based on capacity of the main memory 117.

Figure 2B:
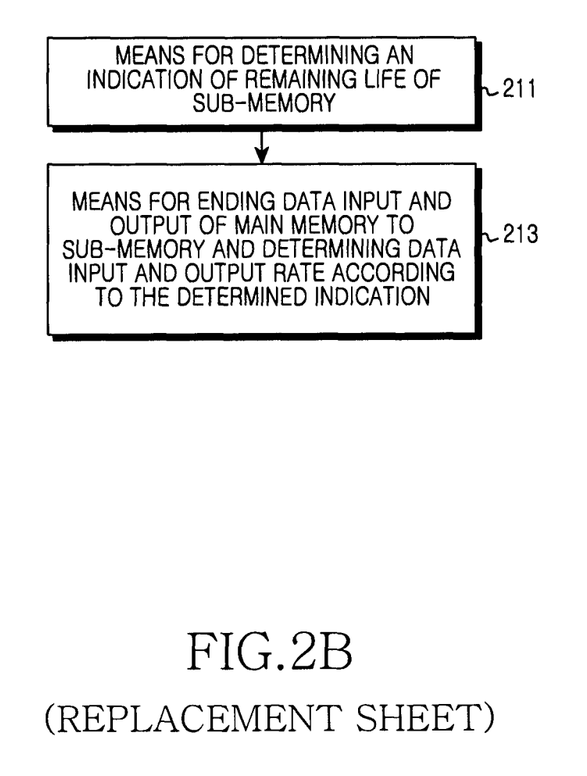
FIG. 2B is a block diagram illustrating a process of controlling data input and output of a main memory to a sub-memory, according to lifetime information of the sub-memory in an electronic device according to aspects of the present disclosure.

FIG. 2B is a block diagram illustrating a process of controlling data input and output of a main memory to a sub-memory based on lifetime information of the sub-memory according to aspects of the disclosure.

Referring to FIGS. 1A and 2B, the electronic device 100 includes a means 211 for determining an indication of remaining life of the sub-memory 118. In addition, the electronic device 100 includes a means for calculating a lifetime of the sub-memory 118 based on state information of the sub-memory 118 and a means for storing the determined indication of remaining life. Herein, the sub-memory 118 may include a means for calculating and storing its lifetime for itself. If the sub-memory 118 does not determine and store its lifetime for itself, the electronic device 100 may include a separate means for calculating and storing the lifetime of the sub-memory 118.

In addition, the electronic device 100 includes a means 213 for ending the data input and output of the main memory 117 to the sub-memory 118 or determining a data input and output rate according to the determined indication of remaining life of the sub-memory 118. Herein, the electronic device 100 may include a means for transmitting data stored in the main memory 117 to the sub-memory 118 to secure capacity of the main memory 117.

Figure 3:
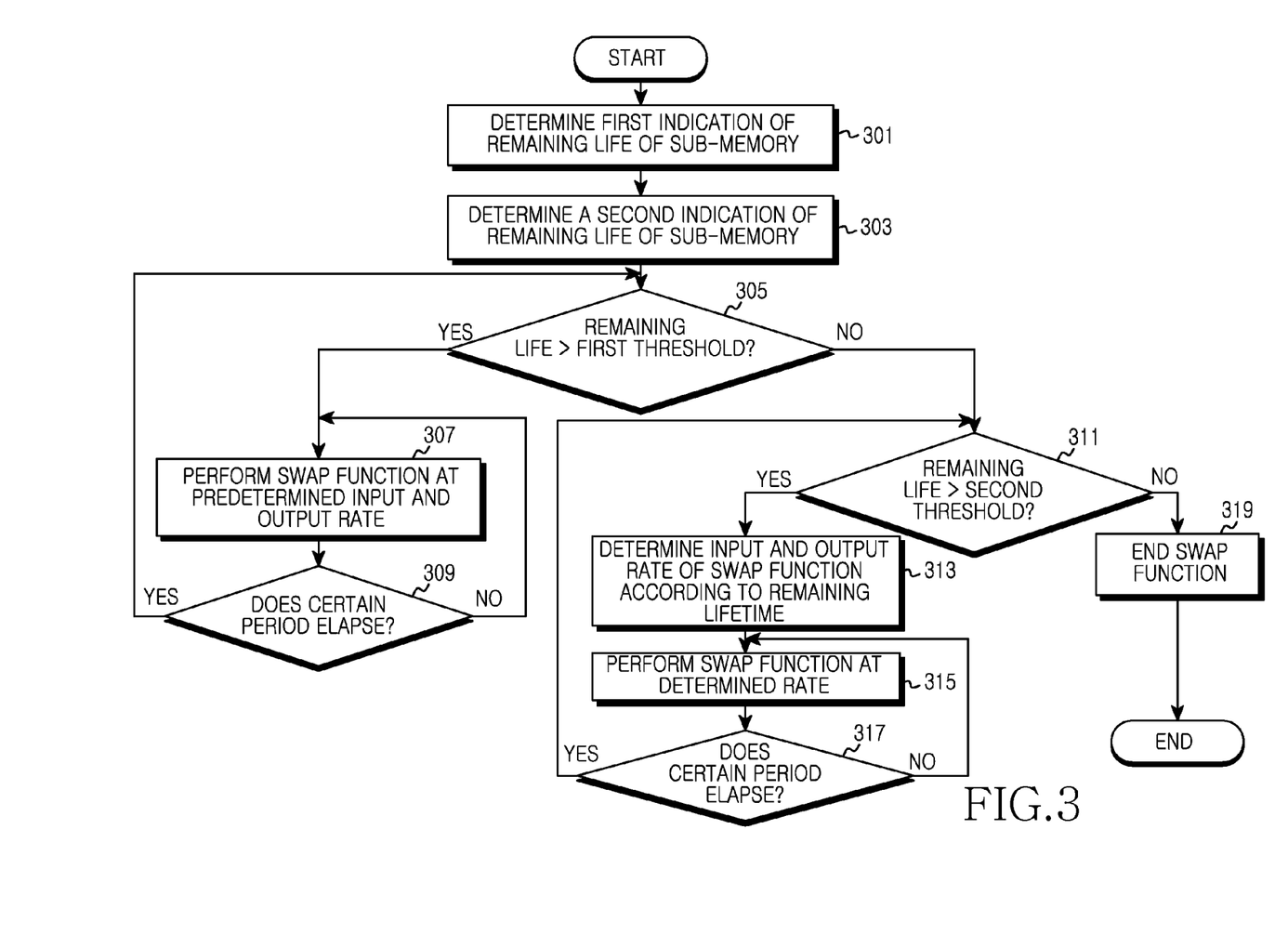
FIG. 3 is a flowchart illustrating a process of controlling a swap function, according to aspects of the present disclosure.
Figure 4:
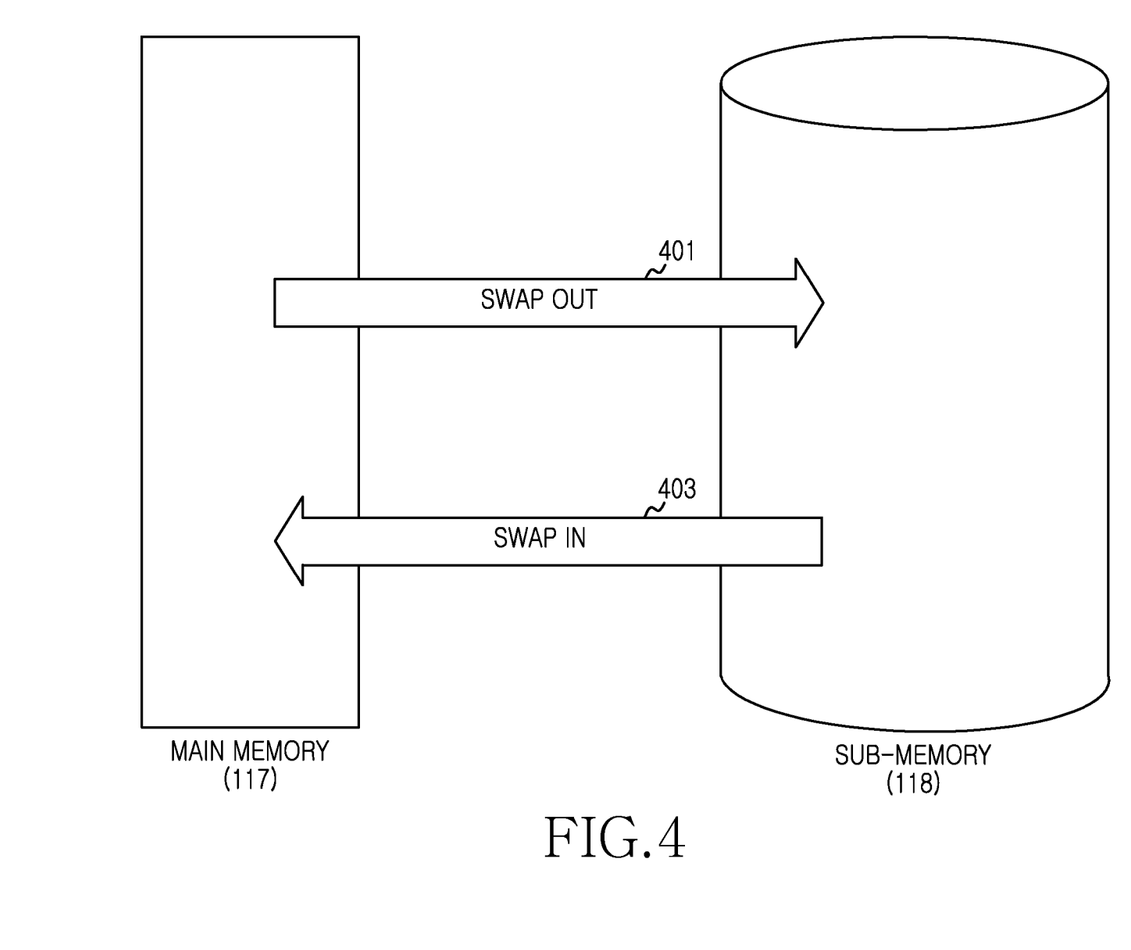
FIG. 4 illustrates a data input and output process according to a swap function in an electronic device, according to aspects of the present disclosure.

FIG. 3 is a flowchart illustrating a process of controlling a swap function according to aspects of the disclosure. The swap function, as shown in FIG. 4, includes a transfer of data between the main memory 117 and the sub-memory 117 in order to free space in the main memory 117. In this example, the transfer of data stored in the main memory 117 to the sub-memory 118 is referred to as a "SWAP OUT" 401. Conversely, the transfer of data data stored in the sub-memory 118 to the main memory 117 is referred to as a "SWAP IN" 403.

In step 301, the electronic device 100 determines a first indication of remaining life the sub-memory 118. More particularly, in some implementations, the electronic device may obtain state information of the sub-memory 118. The state information may be obtained when the electronic device 100 is booted, when a certain period elapses, when input of a user is received, and/or any other suitable triggering event. The state information of the sub-memory 118 may include lifetime information of the sub-memory 118, a S.M.A.R.T. attribute value that is obtained by a S.M.A.R.T. monitoring system of the sub-memory 118, and/or any other suitable information indicating a wear on the sub-memory 118.

In step 303, the electronic device 100 determines a second indication of remaining life of the sub-memory 118 based on the first indication of the remaining life of the sub-memory 118. For example, the electronic device 100 may determine the second indication of the remaining life of the sub-memory 118 by weighing the first indication according to a predetermined weight value.

In step 305 the electronic device 100 determines whether the second indication of the remaining life of the sub-memory 118 is greater than a first threshold. If the remaining life of the sub-memory 118 is greater than the first threshold, the process proceeds to step 307. Otherwise, if the remaining life of the sub-memory 118 is less than the first threshold, the process proceeds to step 311.

Figure 5:
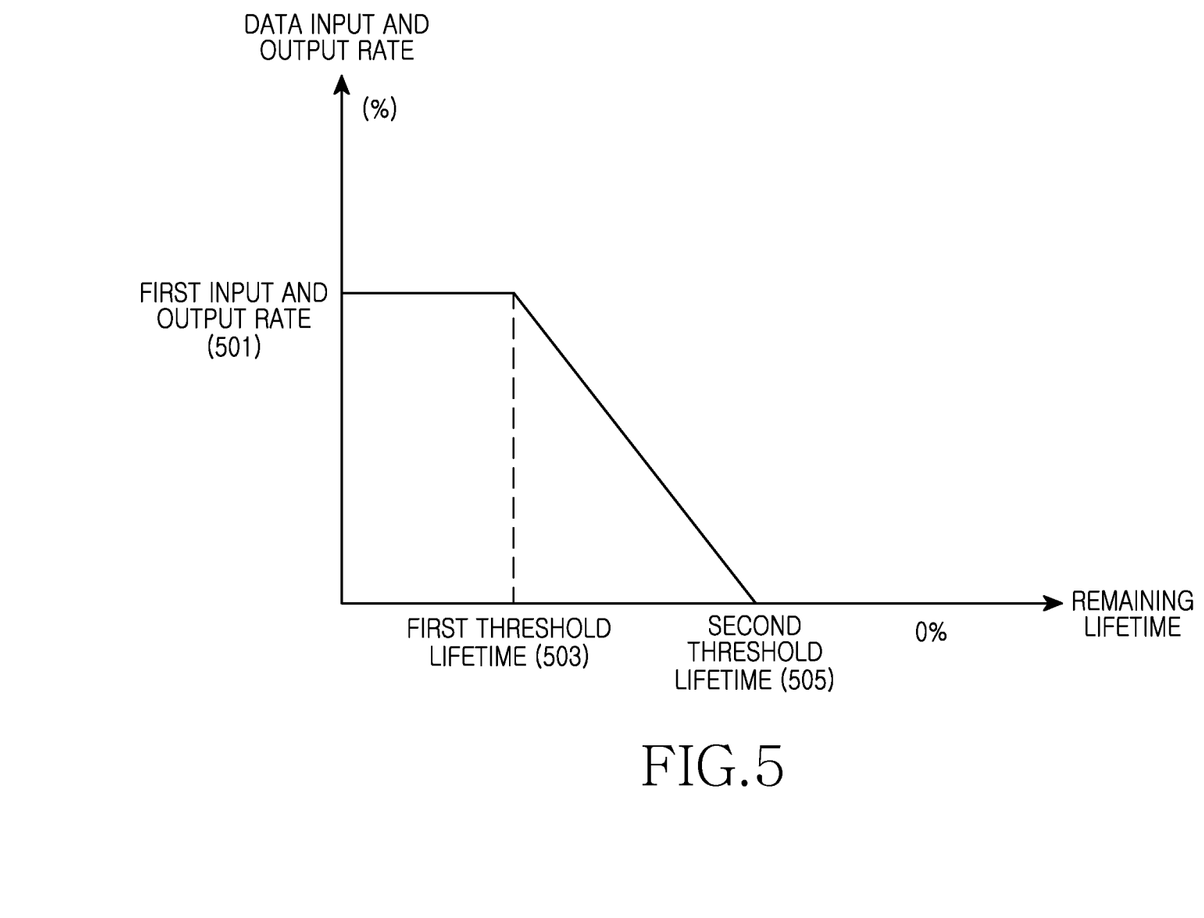
FIG. 5 is a plot illustrating changes in the rate at which a swap space is utilized that are made based on an indication of a remaining life of a sub-memory implementing the swap space, according to aspects of the present disclosure.

In step 307, the electronic device 100 enters a state in which it performs a swap function at a predetermined input and output rate. For example, as shown in FIG. 5, when the second indication of remaining life of the sub-memory 118 is greater than a first threshold 503, the electronic device may perform the swap function for the sub-memory based on a predetermined first input and output rate 501 that may remain fixed for as long as the remaining life of the sub-memory 118 remains above the first threshold. In step 309, the electronic device 100 verifies whether a certain period has elapsed. In some instances, the period may be specified via user input. If the period has elapsed, the process returns to step 305. Otherwise, if the period has not elapsed, the process returns to step 307.

In step 311, the electronic device 100 determines whether the second indication of remaining life of the sub-memory 118 is greater than a second threshold. If the remaining life of the sub-memory 118 is greater than the second threshold value, the process proceeds to step 313. Otherwise, if the remaining life of the sub-memory is greater than the second threshold value, the process proceeds to step 319.

In step 313, the electronic device 100 determines an input and output rate of the swap function according to the second indication of remaining life of the sub-memory 118. That is, when the remaining life of the sub-memory 118 is less than or equal to the first threshold while being greater than the second threshold, the electronic device 100 may adjust the data input and output rate of the swap function according to the remaining life of the sub-memory 118. For example, as shown in FIG. 5, when the remaining life of the sub-memory 118 is less than or equal to the first threshold lifetime 503 while being greater than a second threshold lifetime 505, the electronic device 100 may adjust a data input and output rate of the swap function according to the remaining life of the sub-memory 118. Herein, the smaller the remaining life of the sub-memory 118, the greater the reduction in the data input and output rate of the swap function. In addition, when the data input and output rate of the swap function is adjusted according to the lifetime of the sub-memory 118, the electronic device 100 may output a graphic effect or an audio signal indicating that the data input and output rate of the swap function is adjusted. In step 315, the electronic device 100 enters a state in which it performs the swap function at the rate determined at step 313. In step 317, the electronic device determines whether a predetermined time period has elapsed. If the predetermined period has elapsed, the process returns to step 311. Otherwise, if the predetermined period has not elapsed, the process returns to step 313.

In step 319, the electronic device stops performing the swap function. Although, in the above example, the second indication of remaining life is compared against the first and second thresholds, in other examples, as in indicated in the discussion with respect to FIG. 1B for instance, the first indication of remaining thresholds may be compared against the first and second thresholds, at steps 305 and 311. In such instances, step 303 may be omitted.

The operations discussed in the present disclosure may be implemented in computer software that is executed by a processor, or hardware, or a combination of software and hardware, which include structures disclosed in the specification of the present disclosure and equivalent structures of them. Also, the functions discussed in the present disclosure may be implemented as one or more computer program products that include processor-executable instructions stored in a non-transitory computer-readable medium. The computer readable medium may be a machine readable storage medium, a machine readable storage board, a memory device, composition of materials which have an influence on a machine readable propagation stream, or the combination of one or more of them. The term "data processing device" includes a programmable processor, a computer, or all devices, apparatuses, and machines, including a multi-processor or a computer, for processing data. The devices may include codes for being added in hardware and generating execution environments for a corresponding computer program, for example, codes configuring processor firmware, a protocol stack, a database management system, an operating system, or the combination of one or more of them.

The above-described embodiments of the present disclosure can be implemented in hardware, firmware or via the execution of software or computer code that can be stored in a recording medium such as a CD ROM, a Digital Versatile Disc (DVD), a magnetic tape, a RAM, a floppy disk, a hard disk, or a magneto-optical disk or computer code downloaded over a network originally stored on a remote recording medium or a non-transitory machine readable medium and to be stored on a local recording medium, so that the methods described herein can be rendered via such software that is stored on the recording medium using a general purpose computer, or a special processor or in programmable or dedicated hardware, such as an ASIC or FPGA. As would be understood in the art, the computer, the processor, microprocessor controller or the programmable hardware include memory components, e.g., RAM, ROM, Flash, etc. that may store or receive software or computer code that when accessed and executed by the computer, processor or hardware implement the processing methods described herein. In addition, it would be recognized that when a general purpose computer accesses code for implementing the processing shown herein, the execution of the code transforms the general purpose computer into a special purpose computer for executing the processing shown herein. Any of the functions and steps provided in the Figures may be implemented in hardware, software or a combination of both and may be performed in whole or in part within the programmed instructions of a computer. No claim element herein is to be construed under the provisions of 35 U.S.C. 112, sixth paragraph, unless the element is expressly recited using the phrase "means for".

While the present disclosure has presented certain examples, it will be understood by those skilled in the art that various changes in form and details may be made therein without departing from the spirit and scope of the disclosure as defined by the appended claims.

What is claimed is:

1. A method comprising:
    determining an indication of remaining life of a memory component that is used as a swap space by an electronic device;
    determining an occurrence rate of a swap at which data is written to and read from the memory component, based on the indication of remaining life; and
    performing a swap operation about the memory component based on the determined occurrence rate of the swap;
    wherein the occurrence rate of the swap is determined as a rate corresponding to the indication of the remaining life.

2. The method of claim 1, wherein the indication of remaining life is determined based on a number of times that data input and output for the memory component is occurred, and a number of times that data input and output for the memory component is guaranteed, and
    wherein the indication of remaining life indicates a residual number of times of data input/output.

3. The method of claim 1, wherein the indication of remaining life is determined based on state information maintained by the memory component in a dedicated register of the memory component.

4. The method of claim 1, wherein the indication of remaining life is determined based on attribute information obtained from a Self-Monitoring, Analysis and Reporting Technology (S.M.A.R.T) system that is at least in part integrated into the memory component, the attribute information including at least one of a reallocated sectors count value, a seek error rate value, a spin retry count value, a reallocation event count value, and a current pending sectors count value.

5. The method of claim 1, wherein determining an occurrence rate of a swap comprises using the memory component as a swap space at a first swap rate when the indication of remaining life is greater than a first threshold.

6. The method of claim 5, wherein determining an occurrence rate of a swap further comprises using the memory component as a swap space at a second swap rate when the indication of remaining life is smaller than the first threshold and greater than a second threshold, the second swap rate being proportional to remaining life of the memory component.

7. The method of claim 6, wherein determining an occurrence rate of a swap further comprises discontinuing the use of the memory component as a swap space when the indication of remaining life is smaller than both the first threshold and the second threshold.

8. The method of claim 1, wherein the indication of remaining life of the memory component is determined by the electronic device in response to at least one of the electronic device booting up, an expiration of a predetermined time period, and a receipt of a user input at the electronic device.

9. The method of claim 1, further comprising outputting at least one of a visual indication and an audio indication of the remaining life of the memory component.

10. The method of claim 1, further comprising outputting at least one of a visual indication and an audio indication of the occurrence rate of the swap at which data is written to and read from the memory component.

11. An electronic device comprising:
a first memory component;
a second memory component that is used as a swap space for the first memory component; and
a processor configured to:
determine an indication of remaining life of the second memory component;
determine an occurrence rate of a swap at which data is written to and read from the second memory component, based on the indication of remaining life; and
perform a swap operation about the second memory component based on the determined occurrence rate of the swap;
wherein the occurrence rate of the swap is determined as a rate corresponding to the indication of the remaining life.

12. The electronic device of claim 11, wherein the indication of remaining life is determined based on a number of times data input and output for the second memory component is occurred, and a number of times that data input and output for the memory component is guaranteed, and wherein the indication of remaining life indicates a residual number of times of data input/output.

13. The electronic device of claim 11, wherein the indication of remaining life is determined based on state information maintained by the second memory component in a dedicated register of the second memory component.

14. The electronic device of claim 11, wherein the indication of remaining life is determined based on attribute information obtained from a Self-Monitoring, Analysis and Reporting Technology (S.M.A.R.T) system that is at least in part integrated into the second memory component, the attribute information including at least one of a reallocated sectors count value, a seek error rate value, a spin retry count value, a reallocation event count value, and a current pending sectors count value.

15. The electronic device of claim 11, wherein determining an occurrence rate of a swap comprises using the second memory component as a swap space at a first swap rate when the indication of remaining life is greater than a first threshold.

16. The electronic device of claim 15, wherein determining an occurrence rate of a swap further comprises using the second memory component as a swap space at a second swap rate when the indication of remaining life is smaller than the first threshold and greater than a second threshold, the second swap rate being proportional to the remaining life of the second memory component.

17. The electronic device of claim 16, wherein determining an occurrence rate of a swap further comprises discontinuing the use of the second memory component as a swap space when the indication of remaining life is smaller than both the first threshold and the second threshold.

18. The electronic device of claim 11, wherein the indication of remaining life of the second memory component is determined in response to at least one of the electronic device booting up, an expiration of a predetermined time period, and a receipt of a user input at the electronic device.

19. The electronic device of claim 11, wherein the processor is further configured to output at least one of a visual indication and an audio indication of the remaining life of the second memory component.

20. The electronic device of claim 11, wherein the processor is further configured to output at least one of a visual indication and an audio indication of the occurrence rate of the swap at which data written to and read from the second memory component.

* * * * *